United States Patent
Shabde et al.

(10) Patent No.: US 6,407,558 B2
(45) Date of Patent: Jun. 18, 2002

(54) METHOD OF DETERMINING THE DOPING CONCENTRATION ACROSS A SURFACE OF A SEMICONDUCTOR MATERIAL

(75) Inventors: Sunil N. Shabde, Cupertino; Yowjuang William Liu, San Jose; Ting Yiu Tsui, Palo Alto, all of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 39 days.

(21) Appl. No.: 09/738,475

(22) Filed: Dec. 15, 2000

Related U.S. Application Data

(62) Division of application No. 09/131,301, filed on Aug. 10, 1998, now Pat. No. 6,208,154.

(51) Int. Cl.$^7$ .................... G01R 31/26; H01J 37/26
(52) U.S. Cl. .................... 324/750; 250/306; 324/766
(58) Field of Search ................... 324/750, 765, 324/766, 767, 719; 73/105; 250/306, 307

(56) References Cited

U.S. PATENT DOCUMENTS

| | | | |
|---|---|---|---|
| 4,706,015 A | 11/1987 | Chen | 324/719 |
| 4,803,435 A | 2/1989 | Mills | 324/456 |
| 4,816,755 A | 3/1989 | Look et al. | 324/765 |
| 5,420,796 A | 5/1995 | Weling et al. | 250/306 |
| 5,426,302 A | 6/1995 | Marchman et al. | 250/306 |
| 5,442,221 A | 8/1995 | Mosser et al. | 257/425 |
| 5,489,774 A | 2/1996 | Akamine et al. | 250/306 |
| 5,517,027 A | 5/1996 | Nakagawa et al. | 250/306 |
| 5,517,170 A | 5/1996 | Peters et al. | 338/32 H |
| 5,520,769 A | 5/1996 | Barrett et al. | 438/17 |
| 5,528,067 A | 6/1996 | Farb | 257/401 |
| 5,543,988 A | 8/1996 | Brady et al. | 360/112 |
| 5,585,734 A | * 12/1996 | Meuris et al. | 250/306 |
| 5,652,151 A | 7/1997 | Asada | 438/18 |
| 5,668,395 A | 9/1997 | Razeghi | 257/441 |
| 5,705,403 A | 1/1998 | Baek et al. | 438/16 |
| 5,710,052 A | 1/1998 | Alvis et al. | 324/765 |
| 5,723,981 A | * 3/1998 | Hellemans et al. | 250/306 |
| 6,091,248 A | 7/2000 | Hellemans et al. | 324/719 |

* cited by examiner

Primary Examiner—Ernest Karlsen
(74) Attorney, Agent, or Firm—Eschweiler & Associates, LLC

(57) ABSTRACT

A method (100) of determining a doping concentration of a semiconductor material (101) includes the steps of moving carriers (102) in the material, wherein a number of carriers is a function of the doping concentration of the material (101). The carriers are deflected (130) toward a surface (110) of the material (101) and an accumulated charge profile on the surface of the material, due to the deflected carriers, is detected (140) and used to calculate (180) the doping concentration across a surface (110) of the material (101).

6 Claims, 5 Drawing Sheets

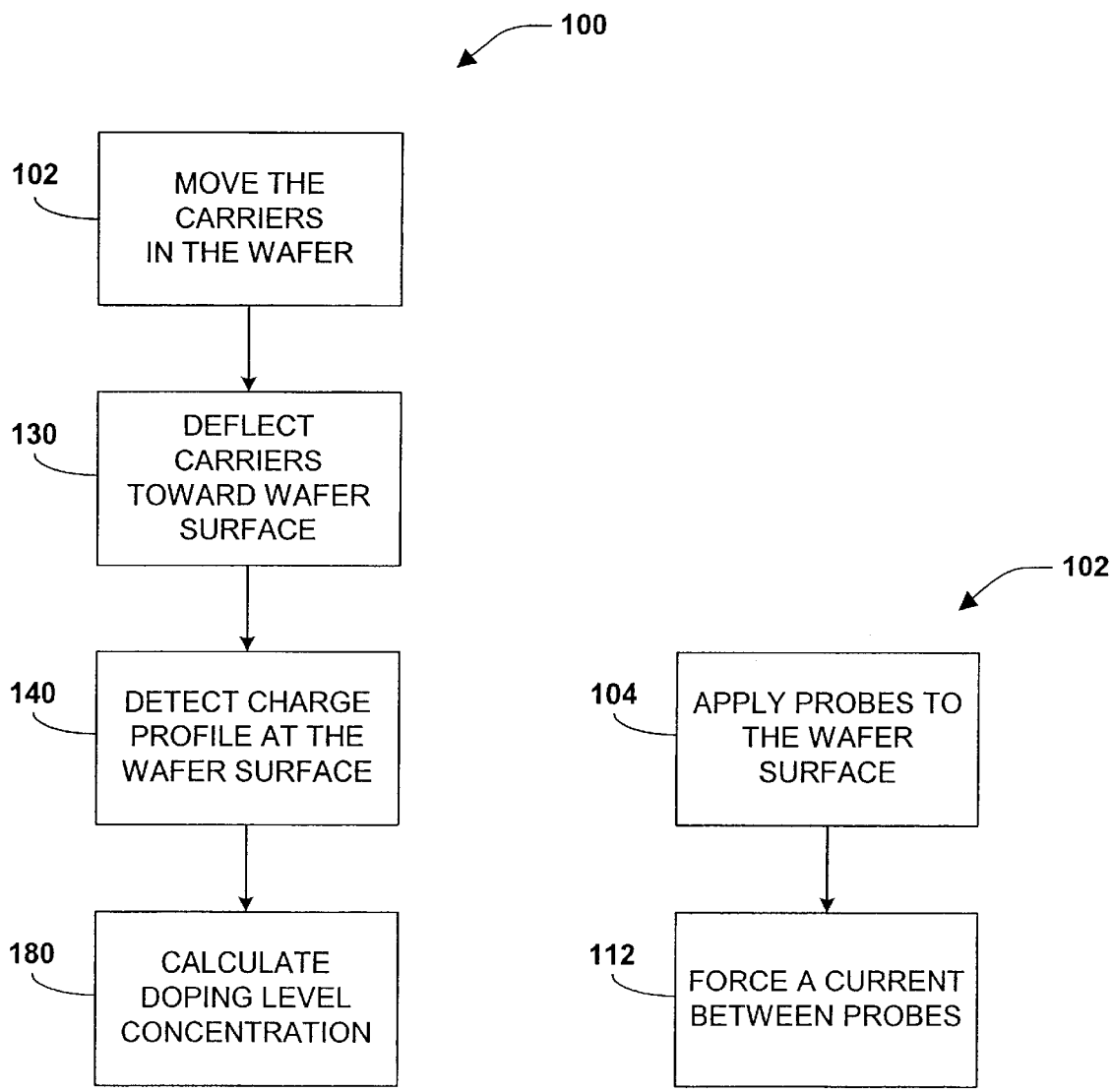

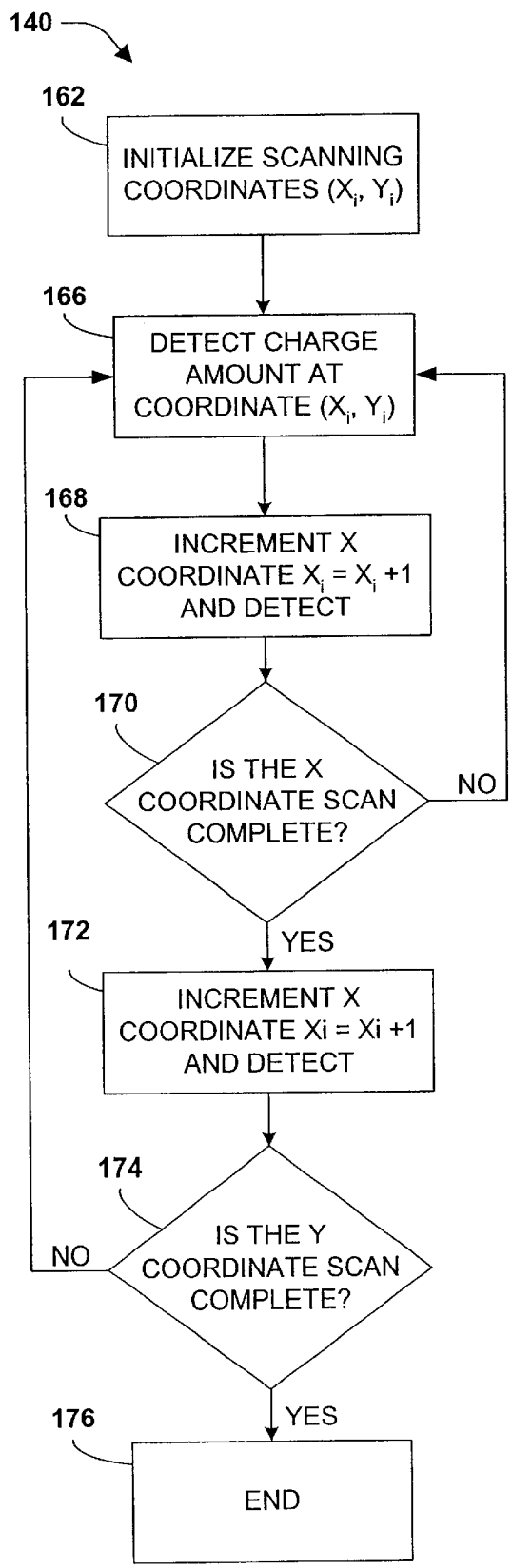
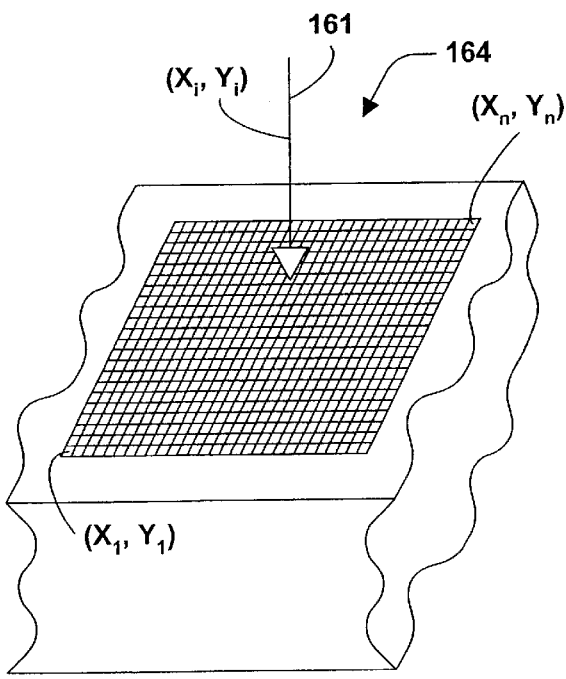
FIGURE 10
FIGURE 9

METHOD OF DETERMINING THE DOPING CONCENTRATION ACROSS A SURFACE OF A SEMICONDUCTOR MATERIAL

RELATED APPLICATION

This application is a divisional of Ser. No. 09/131,301 filed Aug. 10, 1998, now U.S. Pat. No. 6,208,154, which is entitled "Method of Determining the Doping Concentration Across a Surface of a Semiconductor Material".

FIELD OF THE INVENTION

The present invention generally relates to a method of determining a doping concentration for a semiconductor starting material, and more particularly relates to a method of scanning a semiconductor wafer and mapping a doping concentration across the wafer surface using the Hall effect.

BACKGROUND OF THE INVENTION

The fabrication of semiconductor integrated circuits begins with a semiconductor wafer (e.g., silicon) which is often referred to as the "starting material." Typically the starting material is a lightly doped p-type wafer (with an approximate dose of about $5 \times 10^{14}$–$1 \times 10^{15}$ atoms/cm$^2$) having a <100> crystal orientation. It is desirable that the doping concentration (atoms/cm$^3$) be relatively uniform across a single wafer (e.g., within about 1%) and be within a range of about $10^{14}$ to $10^{16}$ atoms/cm$^3$ and be uniform from wafer to wafer to provide a resistivity of about 2 to 100 $\Omega$-cm. One of the reasons that the doping level uniformity is important is that the doping level of the wafer (i.e., the substrate for various semiconductor devices) impacts the resultant threshold voltage for transistors built on and in the substrate as well as other transistor device parameters.

When the source and substrate of a transistor are shorted together ($V_{SB}=0$), the transistor threshold voltage ($V_T$) can be characterized by the following equation:

$$V_T = V_{TO} = \phi_{ms} - 2\phi_f - Q_{tot}/C_{OX} - Q_{BO}/C_{OX},$$

wherein $\phi_{ms}$ is the work function difference between the gate material and the bulk silicon in the transistor channel, $\phi_f$ is the equilibrium electrostatic potential, $Q_{BO}$ is the charge stored per unit area (C/cm$^2$) in the depletion region, $C_{OX}$ is the gate oxide capacitance per unit area (F/cm$^2$), and $Q_{tot}$ is the total positive oxide charge per unit area present at the oxide/bulk interface. $\phi_{ms}$, $\phi_f$ and $Q_{BO}$ are each dependent upon the doping concentration of the starting material, wherein an increase in the doping concentration of the substrate changes the above parameters and results in an increase in the threshold voltage ($V_T$). Consequently, non-uniform doping concentrations within a wafer and between wafers is undesirable since it results in variations in the resulting transistor threshold voltages for various semiconductor devices.

In addition to it being desirable to provide starting material which provides uniform transistor threshold voltages within a wafer and between wafers, it is also desirable for the starting material to provide a low source/drain-to-substrate capacitance, a high source/drain-to-substrate breakdown voltage, high current mobility and a low sensitivity to source-substrate bias effects. A deviation in the desired doping concentration, however, impacts the above characteristics. For example, an increase in the wafer doping concentration undesirably results in a decrease in the junction breakdown voltage, increases the junction capacitance and lowers the carrier mobility.

Because the wafer doping concentration level and uniformity is an important characteristic, electrical specifications are provided for the starting material which include, for example: the conductivity type of the wafer, the average resistivity or resistivity range ($\Omega$-cm), the radial resistivity gradient (% variation) and resistivity variations. The conductivity type information includes whether the wafer is an n-type or a p-type wafer and indicates what element was used to dope the wafer (e.g., arsenic, phosphorous, boron, etc.). The wafer resistivity relates to the doping density of the wafer (atoms/cm$^3$) and is measured using a four-point probe technique. The radial resistivity gradient provides a measure of the variation of the resistivity between the center and selected outer regions of the wafer, and the resistivity variations represent local variations of the resistivity on the wafer. Both the radial resistivity and the resistivity variations are also measured using a four-point probe technique.

The four-point probe technique is used to measure the sheet resistance Rs of a film. The sheet resistance Rs of a film (which in this instance is the wafer) is determined as follows in conjunction with prior art FIG. 1. The resistance (R) of a rectangular shaped film of length (L), width (W) and thickness (t) is given by the equation:

$$R = \rho L / tW,$$

wherein $\rho$ equals the resistivity of the film, which is unique for a given material, and is measured in $\Omega$-cm. If the length L is equal to the width W, then the rectangle is a square and the equation reduces to:

$$R = \rho/t = Rs,$$

wherein Rs is the sheet resistance in $\Omega$/square and is independent of the size of the square (but does depend on the resistivity of the material and the thickness of the film). Therefore the resistivity $\rho$ and the sheet resistance Rs are distinct parameters that are related by the above equation.

The four-point probe method is illustrated in prior art FIG. 2. If the sample film may be approximated as semi-infinite with respect to the spacings (s) between the four probes (which are spaced apart substantially equally from one another), the current (I) is driven as shown and the voltage drop ($V_1$–$V_2$) is measured across the remaining probes as illustrated in prior art FIG. 2. The sheet resistance may then be calculated according to the following equation:

$$Rs = (V_1 - V_2)(2\pi s)/It.$$

To prevent erroneous readings using the four point technique (e.g., due to thermoelectric heating and cooling) the measurement is often performed with current forced in both directions and the two readings are averaged. Further, the test is often performed at several current levels (i.e., $I_1$, $I_2$, etc.), until the proper current level is found. For example, if the current is too low, the forward and reverse current readings will substantially differ and if the current is too high, I$^2$R heating will result in the measured reading drifting over time. Although the American Society for Testing and Materials (ASTM) provides standards which recommend current levels for a given resistivity range, one may still need to vary the current about the recommended value to achieve the optimum current for an accurate measurement which undesirably takes extra time.

The sheet resistance Rs and the resistivity $\rho$ are found using the measured results and the equation V/I($2\pi s$), wherein s is the probe spacing. The above equation, however, is only accurate if the sample is semi-infinite with respect to the probe spacings, which is often not an accurate assumption. Thus, the sheet resistance is typically calculated by the relation:

$$Rs=(V/I)F_1,$$

wherein $F_1$ is a correction factor which is a function of the average probe distance s and the wafer diameter D (i.e., F1=f(s/D)).

Since the four-point probe technique uses a correction factor and occupies a space of at least 3s due to the four probes, the readings are not totally accurate and further represent merely an average resistivity within the region of 3s. Consequently, it would be desirable to have a method of determining the resistivity of the starting material that provides a more accurate and convenient resistivity reading and a higher resolution mapping of the resistivity across the wafer to thereby determine whether the doping level concentration is sufficiently uniform.

SUMMARY OF THE INVENTION

The present invention relates to a method of mapping the doping concentration across the surface of a material such as a wafer constituting starting material for semiconductor processing. The method includes forcing a current through the wafer and subjecting the wafer to a magnetic field. The magnetic field deflects the carriers in the wafer toward the wafer surface according to the Hall effect. The number of carriers deflected to the wafer surface relates to the doping concentration at each point in the wafer, thereby resulting in a charge accumulation profile at the wafer surface. The charge accumulation profile is detected and used to calculate the doping concentration at each point on the wafer surface, thereby resulting in a doping concentration mapping of the wafer.

According to one aspect of the present invention, the method includes placing two probes on the surface of the wafer to be measured. A constant current is forced through two probes using a current source (e.g., moves charge carriers. The wafer is subjected to a magnetic field which is oriented perpendicular to the current path and according to physical principles characterized as the Hall effect, the magnetic field exerts a force on the carriers in the wafer, thereby deflecting the carriers toward the surface of the wafer. The number of carriers deflected at each point within the wafer is a function of the doping concentration at that point, wherein the greater the doping concentration, the greater the number of carriers. The deflected carriers reach the wafer surface and form a charge accumulation profile at the wafer surface which reflects the doping concentration in the wafer. The charge accumulation profile is then scanned using a charge detection device such as an atomic force microscope and the profile is used to either evaluate the doping uniformity across the wafer by analyzing the profile or to calculate the doping concentration at each point across the wafer.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 3 is a flow chart illustrating a method of determining the doping concentration of a material across the material surface according to the present invention;

FIG. 4 is a flow chart illustrating a step of moving carriers in the material according to the present invention;

FIG. 9 is a flow chart diagram illustrating a method for detecting the accumulated charge profile on a surface of the material by scanning the surface and detecting the charge at each point according to the present invention; and FIG. 10 is a fragmentary perspective view of the wafer illustrating the scanning of the surface using a charge detector to determine the doping concentration at each point on the wafer surface according to the present invention.

DETAILED DESCRIPTION OF THE INVENTION

Figure 1:
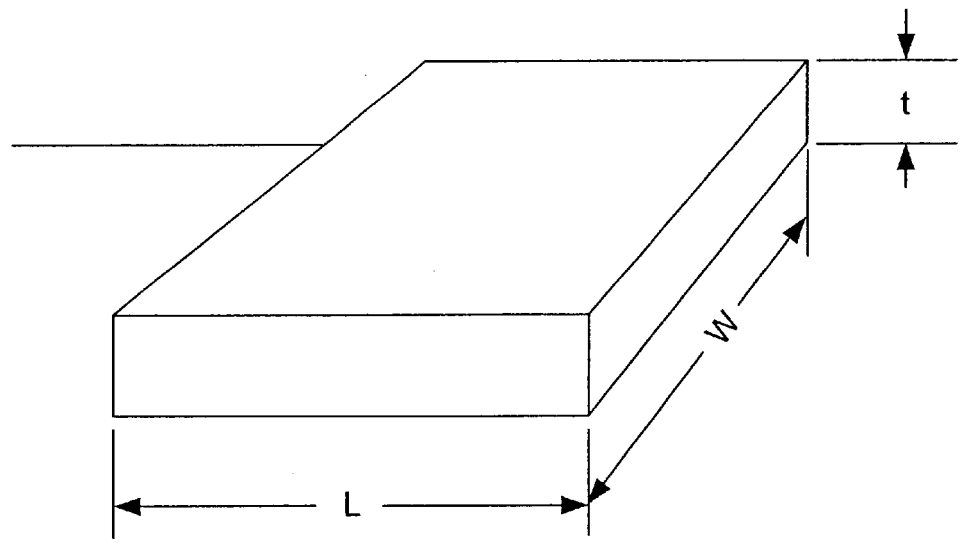
FIG. 1 is a prior art perspective view of a conductive film used for illustrating the principle of a film's sheet resistance.
Figure 2:
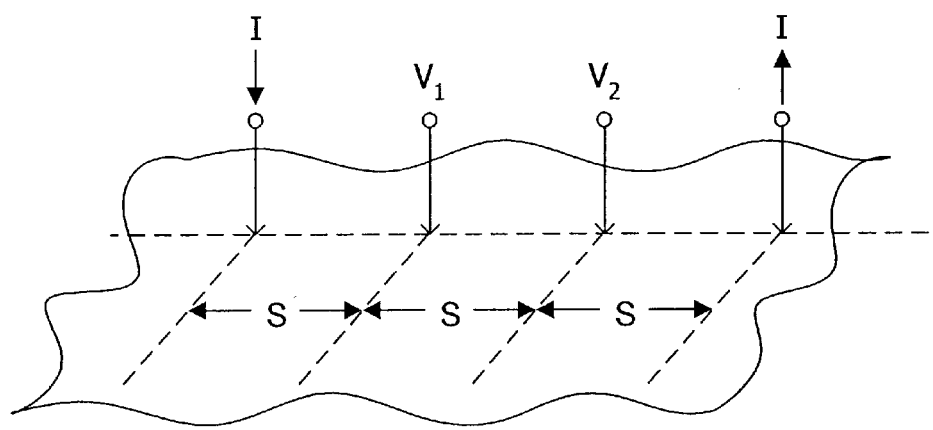
FIG. 2 is a prior art fragmentary perspective view illustrating a four-point probe technique for measuring a sheet resistance of a film.

The following is a detailed description of the present invention made in conjunction with the attached Figures, wherein like reference numerals will refer to like elements throughout. The present invention relates to a method of determining the doping concentration uniformity and the doping concentration of a semiconductor material such as a lightly doped wafer used as a semiconductor starting material. The method includes moving carriers in the material, wherein the number of carriers is a function of the doping concentration of the material. The carriers are then deflected toward the surface of the material to form an accumulated charge profile on the material surface which is detected using a charge detector. The charge profile depends on the number of deflected carriers and thus reflects the doping concentration and the doping concentration uniformity across the material.

In a preferred embodiment of the present invention, the carriers are moved by forcing a current through the wafer using probes. The probes make contact with the wafer surface and are connected to a current source which forces a constant current between the probes. The carriers are then preferably deflected using the Hall effect by subjecting the wafer to a magnetic field which is perpendicular to the direction of current flow. The magnetic field exerts a force on the carriers which deflects the carriers toward the wafer surface, thus creating a charge accumulation profile at the wafer surface. The accumulated charge is then detected by a charge probe such as an atomic force microscope and used to calculate the doping concentration at each point on the surface of the wafer.

Turning now to the Figures, FIG. 3 is a flow chart representing a method 100 for determining the doping concentration of a semiconductor material. According to a preferred embodiment of the present invention, the semiconductor material is a lightly doped p-type semiconductor wafer 101 to be used as starting material in a semiconductor manufacturing process. Alternatively, however, the method of the present invention is also applicable to any type of doped semiconductor region or film and each such film is contemplated as falling within the scope of the present invention.

Figure 5:
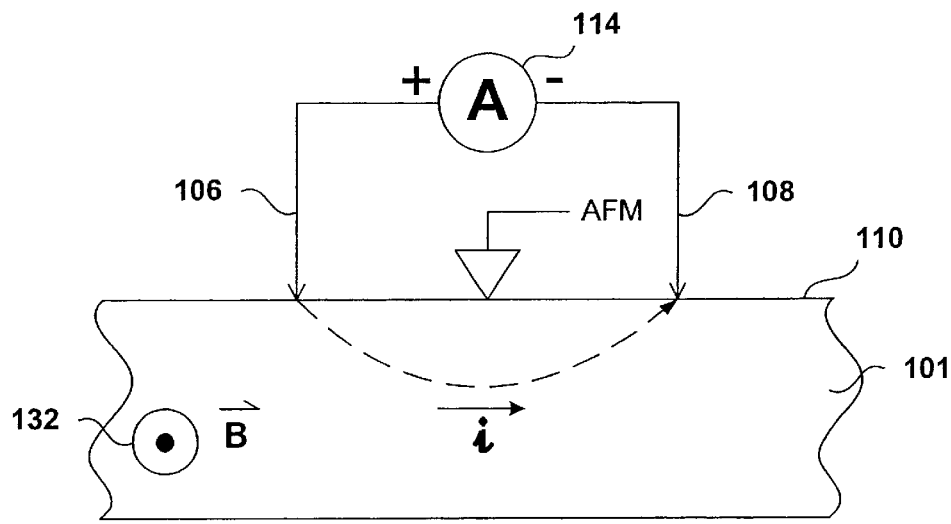
FIG. 5 is a fragmentary cross section diagram illustrating a wafer having a current conducting therethrough via probes on the wafer surface and a charge detector device on the wafer surface according to the present invention.

At step 102 of the method 100, carriers are moved in the wafer. The moving of carriers in the wafer may be accomplished through a variety of means, as is well known by those skilled in the art. Preferably, the movement of carriers in the wafer occurs at step 102 by forcing a current through the wafer, as illustrated in the flow chart of FIG. 4. Forcing a current begins at step 104 and includes applying probes 106 and 108 to a wafer surface 110, as illustrated in FIG. 5. A constant current is then forced through the probes at step 112 using, for example, a current source 114, as illustrated in FIG. 5.

Figure 6A:
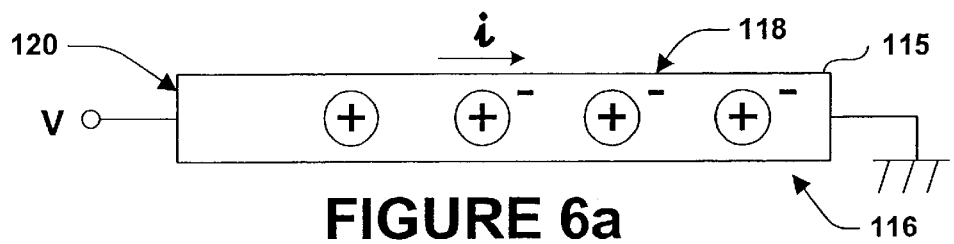
FIGS. 6a–6d are cross section diagrams of a semiconductor material illustrating charge carrier transport through the material according to the present invention.
Figure 6B:
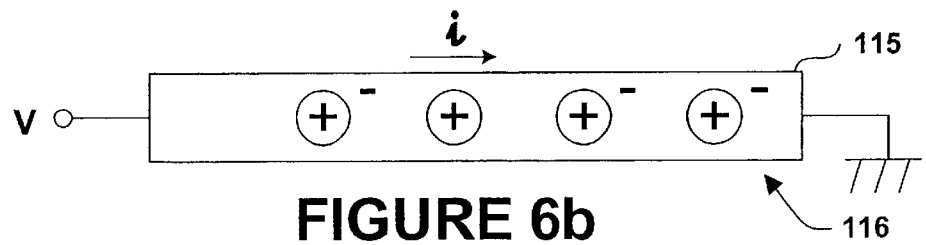
Figure 6C:
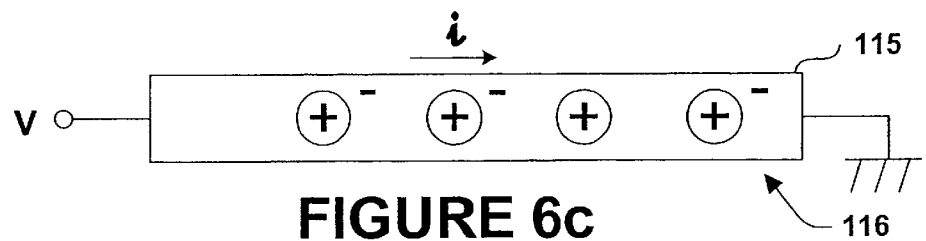
Figure 6D:
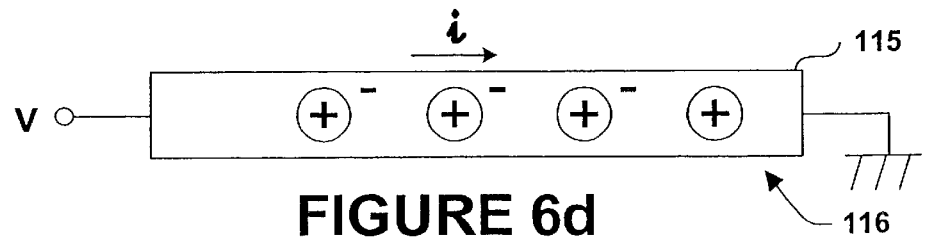

Because the wafer 110 is lightly doped with a p-type dopant, the wafer is somewhat conductive (i.e., having a resistivity between that of a conductor and an insulator; a semiconductor) and a current (i) flows through the wafer 110 according to Ohm's law. The current (i) through the wafer is effectuated by carrier transport, as is well known by those skilled in the art. An exemplary model of carrier transport is illustrated in FIGS. 6a–6d. In FIG. 6a, a p-type semiconductor material 115 such as silicon includes a plurality of positively charge ions 116 (in a p-doped material, an excess of positively charged ions exist compared to the number of free electrons in the material). The p-type material 115 also includes free electrons 118 that join with the positive ions 116 to provide an electrically neutral atom. When a voltage (V) is supplied across the material 115, an electron 118 is pulled out at the left end 120 of the material 115, leaving the array of atoms with a "hole" (i.e., a missing electron which is sometime called a vacancy), as illustrated in FIG. 6a. The electrons 118 then incrementally shift to the left to fill the hole in sequence, as illustrated in FIGS. 6a–6d, thus resulting in the "hole" (i.e., the carrier) moving through the material 115. The collective motion of the electrons from right to left can thus be characterized as the motion of a "hole" from left to right. As can be seen from FIGS. 6a–6d, the number of carriers is a function of the doping level concentration in the material 115. This relation may then be used to help determine the doping level concentration in the material 115.

Similarly, the same principles may be used to characterize carrier transport in n-type doped semiconductor materials. In such a case, the material has an excess of free electrons (as opposed to an excess of positively charged ions) and current is provided through the transport of negative carriers (i.e., the electrons). In any case, once the carriers have been generated at step 102, the carriers are then deflected toward the wafer surface 110 at step 130 of FIG. 3.

According to a preferred embodiment of the invention, the carrier deflection is accomplished by subjecting the wafer 101 to a magnetic field 132, as illustrated in FIG. 5. The magnetic field 132 is oriented in a direction perpendicular to the direction of current flow and deflects the carriers toward the wafer surface 110 in accordance with the Hall effect which will now be discussed and explained in conjunction with FIG. 7.

Figure 7:
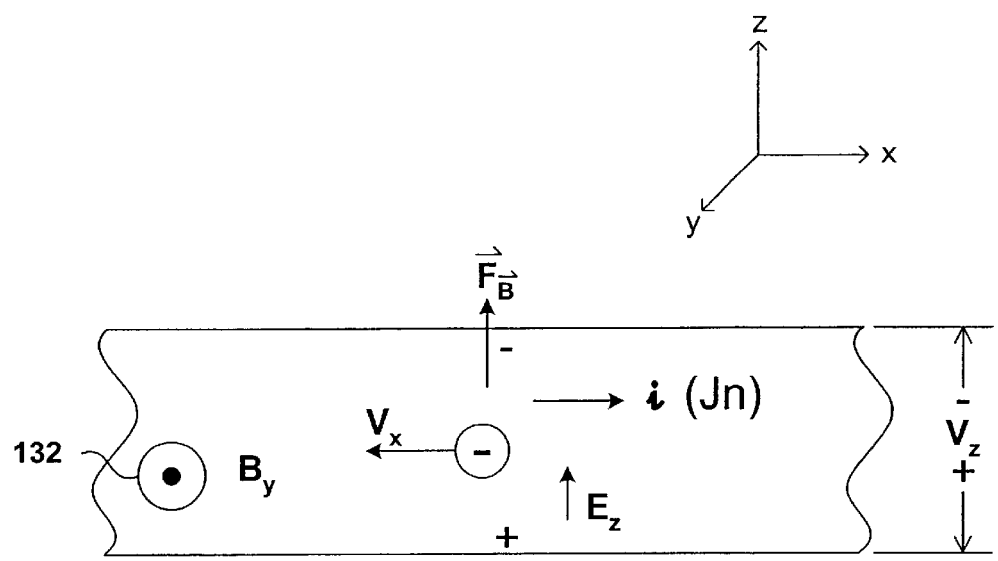
FIG. 7 is a fragmentary cross section diagram illustrating the Hall effect and how an electron traveling through a material in the presence of a magnetic field which is perpendicular to the current exerts a force on the charged particle.

The force exerted on a particle in the presence of an electric and magnetic field is called the Lorentz force and is represented by:

$$F=q(E+v\times B),$$

wherein E is the electric field vector, B is the magnetic field vector and v is the particle velocity vector (which in the case of the present invention is in a direction opposite to the direction of current flow). As can be seen by the above equation, the force exerted by the magnetic field component is in a direction perpendicular to the flow of current if the magnetic field is oriented in a direction perpendicular to the direction of current flow since the magnetic force component (qv×B) is determined by the "curl" of the velocity vector and the magnetic field vector. As illustrated in FIG. 7, if the current (i) is in the positive "x" direction (and thus the velocity vector is in the negative "x" direction) and the magnetic field is directed perpendicularly out of the page, then, according to the "right hand rule", the force exerted on the particle due to the magnetic field will be in the positive "z" direction, thus deflecting the particle toward the wafer surface 110, as illustrated in FIG. 7.

The Hall effect employs this particle deflection principle. In general, the Hall effect can be summarized as follows: a conductive material having a current flowing in the presence of a perpendicular magnetic field will result in a potential difference developing across the conductor. This can be easily seen in FIG. 7. When the magnetic field 132 deflects a carrier (whether positive or negative) towards the wafer surface 110, an accumulation of charge develops at that point on the wafer surface 110 which is proportional to the number of carriers in the wafer at that point. The accumulation of charge thus results in the development of a voltage potential ($V_z$) across the wafer, which is referred to as the Hall voltage.

Once the carriers have been deflected toward the surface at step 130, thus causing a charge accumulation profile to form on the wafer surface 110, the charge profile is detected at step 140 of FIG. 3. In one exemplary embodiment of the present invention, the charge profile can be detected using a voltage probe, a voltage meter or the like. Preferably, however, the charge profile is detected using an atomic force microscope (AFM) such as a Dimension™ 5000 Scanning Probe Microscope manufactured by Digital Instruments. Using an AFM for detecting the charge profile is preferred because the tip is extremely small which allows for an extremely high resolution charge profile to be detected.

Figure 8:
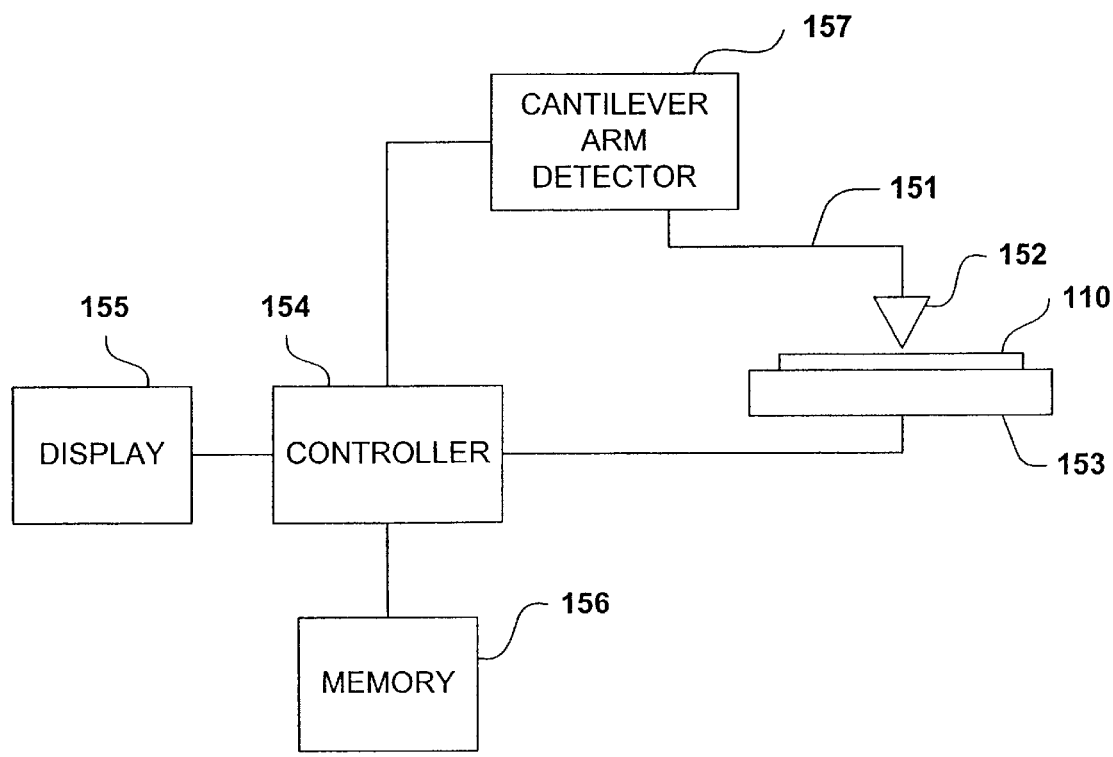
FIG. 8 is a block diagram of a charge detection system according to the present invention.

As is well known by those skilled in the art, an AFM 150, as illustrated in FIG. 8, includes a microminiature cantilever arm 151 and a sharp tip 152 which makes contact with the wafer surface 110. The wafer 110 is placed on a scanning stage 153 which operates to move the wafer 110 with respect to the probe tip 152 to effectively scan the wafer surface 110. The stage 153 may incorporate traditional movement or actuation means (not shown) and may also include piezoelectric actuators for effectuating high precision movement of the stage 153 to provide high resolution scanning. Alternatively, the stage 153 may be kept stationary while similar actuation means may be used to move the cantilever arm 151/probe tip 152 assembly. Regardless of which component is moved relative to the other, the AFM scanning mechanism 150 is controlled by a programmable controller 154 which is operable to receive and analyze detected characteristics such as the accumulated charge and display the collected information to the user via a display 155 and store the data in a memory 156. Although the detection system 150 of FIG. 8 does not illustrate a magnetic field means for the sake of simplicity, the magnetic field 132 of FIG. 5 may be provided using, for example, a permanent magnet, a solenoid, coils, etc. as is well known by those skilled in the art.

The AFM tip 152 preferably detects the accumulated charge in the following manner. As opposed to a contacting mode of operation in which the probe tip 152 rides on the surface 110 of the material to be measured to profile the surface topology, the AFM 150 is operated in a non-contacting mode. In the non-contacting mode, the AFM tip 152 is held a short distance from the wafer surface 110 (about 5 Angstroms to 500 Angstroms) and the tip 152 is deflected by electrostatic forces exerted against the tip 152 by the accumulated charge on the wafer surface 110. According to one exemplary embodiment of the present invention, the accumulated charge at a point on the surface 110 is proportional to the electrostatic force exerted on the AFM tip 152 which thus proportionally impacts the amount of deflection of the AFM tip 152. The amount of cantilever arm 151 deflection is preferably measured using precisely aligned optical components and a deflection measurement circuit (shown collectively as a cantilever arm detector 157 in FIG. 8), although other techniques may be used and are contemplated as falling within the scope of the present invention. For example, the cantilever arm may resonate at a frequency that may be varied in response to the influence of the electrostatic forces caused by the accumulated charge.

An exemplary method 140 of detecting the charge profile includes scanning the wafer surface 110 with a charge detector 161 such as an AFM, as illustrated in the flow chart of FIG. 9, which will be discussed in conjunction with FIG. 10. Under the control of a microcontroller, the detector 161 initializes the scanning coordinates at step 162 so that the detection scheme begins at a first coordinate ($X_1$, $Y_1$). Although not shown in FIG. 10 for the sake of simplicity, the probes 106 and 108 (shown in FIG. 5) are placed across a square of the grid which corresponds to the location of the detector 161 so that each square of the grid will experience a uniform, constant current in the region being detected. Preferably, the first coordinate ($X_1$, $Y_1$) is at a corner of a square grid 164, as illustrated in FIG. 10, and the grid 164 is scanned by the detector 161 row by row. Alternatively, any method of scanning some or all of the points on the grid 164 may be used and each is contemplated as falling within the scope of the present invention.

Once the detector 161 is at the coordinate ($X_1$, $Y_1$), the detector 161 detects the charge amount at that point at step 166 by detecting the voltage at that point by, for example, detecting the amount of deflection of the AFM tip 152 due to the electrostatic force exerted by the accumulated charge as discussed above. After the charge amount is detected at step 166, the detector 161 is moved to the next coordinate (e.g., $X_2$, $Y_1$) at step 168 and the charge amount at that point is detected. The detector 161 continues scanning and detecting in the "x" direction until the "x" coordinate scan is complete at step 170 (YES), which indicates that the detector 161 has completed a row scan. The detector 161 then moves its position incrementally in the "y" direction at step 172 to start scanning a new row (e.g., $X_1$, $Y_2$). The method 160 checks to see whether the grid scan is complete at step 174 by checking whether all the rows have been scanned. According to the present example, all the rows have not yet been scanned (NO), and the method 140 returns to step 166 to scan the row in the "x" direction. Once all the rows have been scanned (YES at step 174), the method 140 for detecting the charge profile on the wafer surface 110 is completed at step 176.

Returning now to FIG. 3, once the charge profile on the wafer surface 110 has been detected at step 140, the method 100 uses the detected charge profile to determine the doping level concentration at one or more of the detected points at step 180. According to the present invention, the doping level is calculated using the detected charge profile (i.e., the measured Hall voltages) in the following manner using the variable references of FIG. 7.

To determine the carrier concentration (n) at a point ($X_j$, $Y_j$) on the wafer surface 110, the following relationship is used:

$$E_Z = V_X B_Y,$$

which represents the equilibrium condition after the magnetic field is applied, wherein $E_Z$ is the electric field formed by the charge accumulation due to the magnetic field, $B_Y$ is the applied magnetic field strength, and $V_X$ is the carrier velocity which is often called the Hall coefficient ($R_H$) and is equal to Jn/qn. With respect to the Hall coefficient, $R_H$=Jn/qn, Jn is the current (i), q is the electric charge and n is the carrier concentration. Since the detected Hall voltage $V_Z$ is detected and is directly related to the resultant electric field $E_Z$, the carrier concentration (n) is inversely proportional to the detected Hall voltage and thus can be easily determined.

In the above manner, the detected charge at each point on the wafer surface 110 can be used to determine the doping level concentration within the wafer 101. The detected charge profile may also be used to ascertain the doping concentration uniformity across the wafer. Furthermore, using an AFM to detect the charge profile is advantageous since a high resolution detection scan may be performed. Consequently, the present invention provides a more accurate method of determining the doping level of a semiconductor material with greater resolution and lower cost than the prior art.

In addition to detecting the doping level concentration via the Hall coefficient as discussed above, a simplified analysis may be conducted to merely evaluate the doping level uniformity using the detected charge profile which was saved in the memory 156 of the AFM system 150. As discussed above in conjunction with FIG. 8, when the detected charge at each point is detected by the AFM 150, the controller 154 saves the charge data in the memory 156 (e.g., the charge at ($X_i$, $Y_i$)=Q($X_i$, $Y_i$)). To evaluate whether the uniformity across the wafer surface 110 meets a minimum requirement, the controller 154 may, for example, access the data in the memory and insert the data into a uniformity algorithm such:

$$Q(X_i, Y_i) - Q(X_{i+1}, Y_{i+1}) > Q_{threshold}.$$

If the charge differential between incremental points is greater than a predetermined threshold, the controller 154 will then indicate the nonuniformity to the user via the display 155. Alternatively, the controller may identify $Q_{max}$ and $Q_{min}$ for the wafer, determine their difference and compare the difference to a threshold for uniformity purposes. In the above manner, without performing additional calculations, the system 150 may provide information on whether the doping concentration level across the wafer is sufficiently uniform.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A system for determining a doping concentration uniformity of a semiconductor wafer, comprising:

a stage accommodating a wafer to be evaluated;

an atomic force microscope system operatively coupled to the stage;

magnetic field means associated with the stage for subjecting the wafer to a magnetic field and deflecting carriers in the wafer to a surface of the wafer, thereby generating an accumulated charge profile; and a controller operatively coupled to the stage and the atomic force microscope for dictating the detection of the accumulated charge profile on the wafer and controlling a positional relationship between the stage and the atomic force microscope.

2. The system of claim 1, wherein the atomic force microscope comprises a microminiature cantilever arm and an atomic force microscope tip for detecting the accumulated charge profile on the wafer.

3. The system of claim 2, wherein the atomic force microscope operates in a non-contacting mode and detects the accumulated charge profile by sensing a deflection of the cantilever arm and tip due to electrostatic forces exerted by the charge profile on the tip.

4. The system of claim 3, wherein the atomic force microscope further comprises a cantilever arm detector which senses the deflection of the cantilever arm and converts the sensed deflection to a detected charge value.

5. The system of claim 1, wherein the controller saves the detected accumulated charge profile as data in a memory, and uses the data to determine whether the doping concentration of the wafer satisfies a uniformity criteria.

6. The system of claim 1, wherein the controller saves the detected accumulated charge profile as data in a memory and uses the data to calculate the doping concentration across the wafer using an algorithm based on the Hall effect.

* * * * *